US 12,334,944 B2

United States Patent
Ghosh et al.

(10) Patent No.: US 12,334,944 B2
(45) Date of Patent: Jun. 17, 2025

(54) MULTI-POINT REFERENCE DISTRIBUTION CIRCUIT

(71) Applicant: Texas Instruments Incorporated, Dallas, TX (US)

(72) Inventors: Sovan Ghosh, Bengaluru (IN); Visvesvaraya Appala Pentakota, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 18/394,031

(22) Filed: Dec. 22, 2023

(65) Prior Publication Data

US 2025/0007528 A1   Jan. 2, 2025

(30) Foreign Application Priority Data

Jun. 27, 2023  (IN) .............................. 202341042922

(51) Int. Cl.
| | |
|---|---|
| H03M 1/06 | (2006.01) |
| G05F 1/46 | (2006.01) |
| G06F 3/041 | (2006.01) |
| H03M 1/08 | (2006.01) |

(52) U.S. Cl.
CPC ................. *H03M 1/06* (2013.01); *G05F 1/46* (2013.01); *G06F 3/041* (2013.01); *H03M 1/08* (2013.01)

(58) Field of Classification Search
CPC ........... H03M 1/06; H03M 1/08; G06F 3/041; G05F 1/46
See application file for complete search history.

(56) References Cited

U.S. PATENT DOCUMENTS

| 5,515,005 A | 5/1996 | Yoshioka |
| 7,215,182 B2 * | 5/2007 | Ali ........................... G06F 3/05 327/543 |
| 2009/0245541 A1 | 10/2009 | Wang |
| 2019/0341890 A1 | 11/2019 | Yoshida |

OTHER PUBLICATIONS

International Search Report in corresponding PCT Application No. PCT/US2024/035587, mailed Nov. 14, 2024.

* cited by examiner

*Primary Examiner* — Joseph J Lauture
(74) *Attorney, Agent, or Firm* — Mandy Barsilai Fernand; Frank D. Cimino

(57) ABSTRACT

A circuit includes an amplifier, a pre-driver circuit, and an output circuit. The amplifier has a first input, a second input, and an output. The pre-driver circuit has an input coupled to the output of the amplifier, a first output, a second output, and a third output coupled to the second input of the amplifier. The output circuit includes a first transistor and a second transistor. The first transistor has a control terminal coupled to the first output of the pre-driver circuit; a first terminal, and a second terminal coupled to the third output of the pre-driver circuit. The second transistor has a control terminal coupled to the second output of the pre-driver circuit, a first terminal coupled to the second terminal of the first transistor, and a second terminal coupled to a reference terminal.

20 Claims, 8 Drawing Sheets

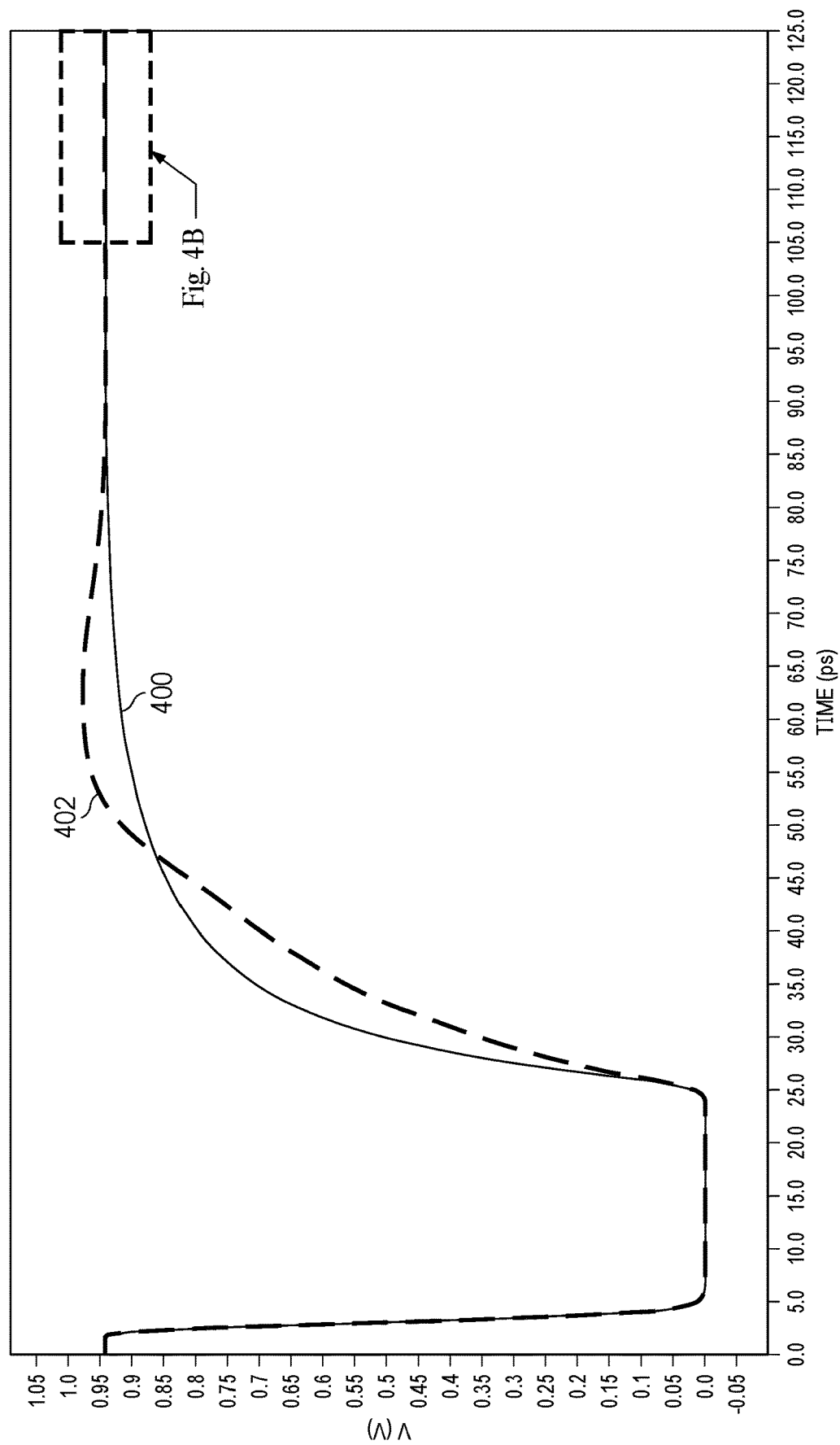

MULTI-POINT REFERENCE DISTRIBUTION CIRCUIT

CROSS-REFERENCE TO RELATED APPLICATIONS

This application claims priority to Indian Provisional Application No. 202341042922, filed Jun. 27, 2023, entitled "Highspeed Reference Distribution Network," which is hereby incorporated by reference in its entirety.

BACKGROUND

Various types of analog-to-digital converters (ADCs) such as successive-approximation-register (SAR) ADCs, Sigma-Delta ADCs, and pipelined ADCs include a capacitive digital-to-analog converter (DAC) as a circuit element. For example, in a SAR ADC, during a conversion process, a capacitive DAC is periodically switched during the conversion process to generate analog voltage levels for comparison with a sampled input signal. Inputs of the capacitive DAC are successively switched to either a reference voltage or ground, thereby drawing current from the reference voltage source. The current drawn by the capacitive DAC can vary with the input signal. The variation in current drawn by capacitive DAC may induce nonlinearity in the reference voltage.

SUMMARY

In one example, a circuit includes an amplifier, a first transistor, a second transistor, a third transistor, a fourth transistor, a fifth transistor, and a sixth transistor. The amplifier has first and second inputs and an output. The first transistor has a control terminal coupled to the output of the amplifier, a first terminal, and a second terminal. The second transistor has a first terminal, a second terminal coupled to the first terminal of the first transistor, and a control terminal. The third transistor has a first terminal, a second terminal coupled to the second input of the amplifier, and a control terminal coupled to the second terminal of the second transistor. The fourth transistor has a control terminal coupled to the output of the amplifier, a first terminal, and a second terminal. The fifth transistor has a control terminal, a first terminal coupled to the second terminal of the fourth transistor, and a second terminal coupled to a reference terminal. The sixth transistor has a control terminal coupled to the first terminal of the fifth transistor, a first terminal coupled to the second terminal of the third transistor, and a second terminal coupled to the reference terminal.

In another example, a circuit includes an amplifier, a pre-driver circuit, and an output circuit. The amplifier has a first input, a second input, and an output. The pre-driver circuit has an input coupled to the output of the amplifier, a first output, a second output, and a third output coupled to the second input of the amplifier. The output circuit includes a first transistor and a second transistor. The first transistor has a control terminal coupled to the first output of the pre-driver circuit; a first terminal, and a second terminal coupled to the third output of the pre-driver circuit. The second transistor has a control terminal coupled to the second output of the pre-driver circuit, a first terminal coupled to the second terminal of the first transistor, and a second terminal coupled to a reference terminal.

In a further example, an analog-to-digital converter (ADC) includes a first capacitive digital-to-analog converter (CDAC), a second CDAC, and a reference buffer. The first CDAC has an input. The second CDAC has an input. The reference buffer is coupled to the first CDAC and the second CDAC. The reference buffer includes an amplifier, a pre-driver circuit, and an output circuit. The amplifier has a first input, a second input, and an output. The pre-driver circuit has an input coupled to the output of the amplifier, a first output, a second output, and a third output coupled to the second input of the amplifier. The output circuit includes a first transistor, a second transistor, a third transistor, and a fourth transistor. The first transistor has a control terminal coupled to the first output of the pre-driver circuit, a first terminal, and a second terminal coupled to the third output of the pre-driver circuit and the input of the first CDAC. The second transistor has a control terminal coupled to the second output of the pre-driver circuit, a first terminal coupled to the second terminal of the first transistor, and a second terminal coupled to a reference terminal. The third transistor has a control terminal coupled to the first output of the pre-driver circuit, a first terminal, and a second terminal coupled to the third output of the pre-driver circuit and the input of the second CDAC. The fourth transistor has a control terminal coupled to the second output of the pre-driver circuit, a first terminal coupled to the second terminal of the third transistor, and a second terminal coupled to a reference terminal.

BRIEF DESCRIPTION OF THE DRAWINGS

FIGS. 4A and 4B are signal diagrams comparing output of a single-point reference distribution circuit to output of the multi-point reference distribution circuit of FIGS. 2A/2B or FIGS. 3A/3B.

DETAILED DESCRIPTION

Analog-to-digital converters (ADCs) and other circuits include a reference voltage circuit that provides a stable voltage for comparison to other voltages in the circuit. For example, a bandgap circuit may be implemented to provide a reference voltage. A buffer circuit may be coupled to the output of the reference voltage circuit to drive the reference voltage to a load circuit. In circuits having variable load current, such as ADCs in which the reference buffer is driving a capacitive digital-to-analog converter (CDAC), the reference voltage provided to the load by the reference buffer may be subject to nonlinearity caused by the change in current flowing through parasitic circuit inductance. Settling times may be introduced to circuit liming to allow the reference voltage to settle to a desired value after change in current draw. The settling times may reduce circuit performance by increasing the time needed to perform an operation, such an analog-to-digital conversion cycle.

The multi-point reference distribution circuit described herein can reduce reference voltage settling time by providing reference buffer outputs distributed across the various load circuit inputs. The distributed outputs reduce the parasitic inductance driven by each output, which reduces the nonlinearity caused by changes in current flow through parasitic inductance.

Figure 1:
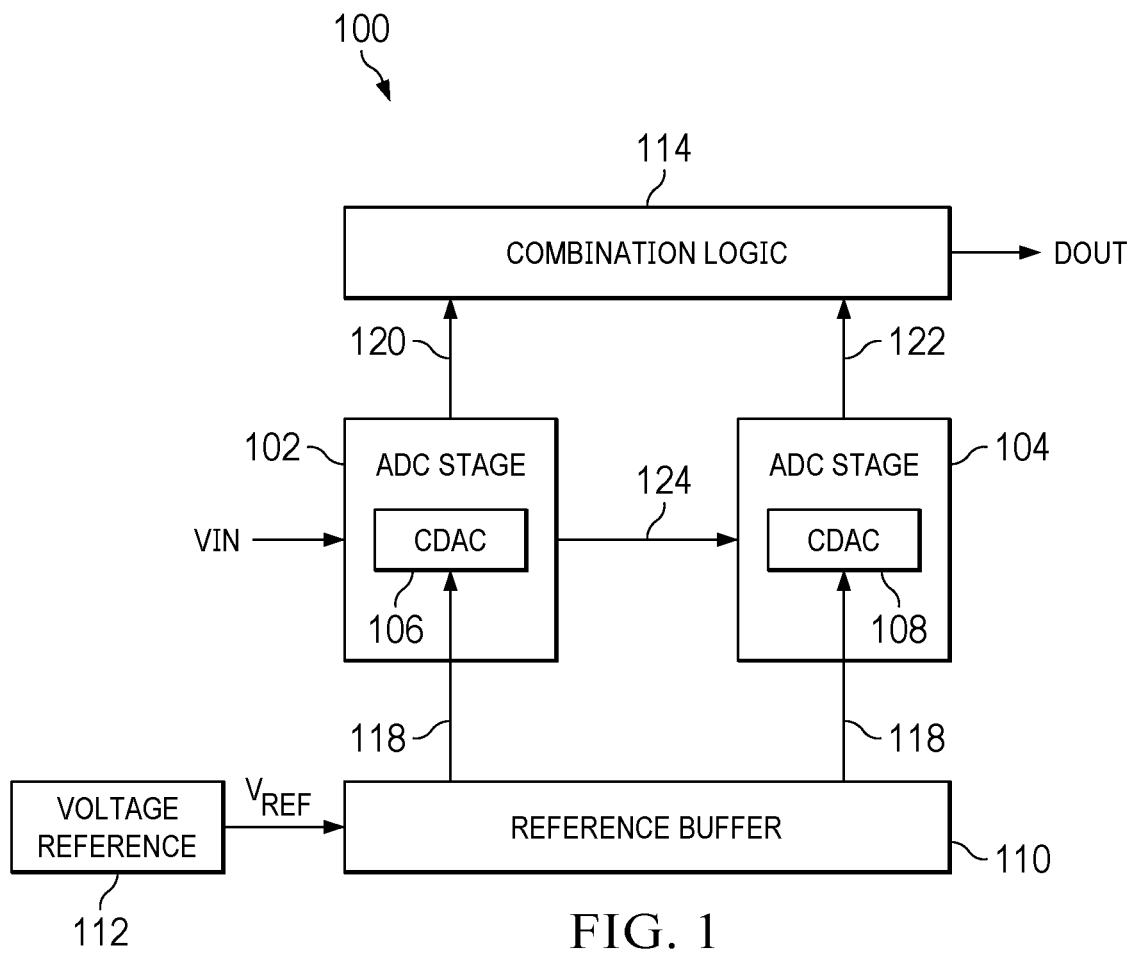
FIG. 1 is a block diagram of an analog-to-digital converter that includes a multi-point reference distribution circuit.

FIG. 1 is a block diagram of an example analog-to-digital converter (ADC) 100. The ADC 100 may be a successive approximation register (SAR) or a pipelined ADC. The ADC 100 includes ADC stages 102 and 104, a reference buffer circuit 110, a voltage reference circuit 112, and combination logic 114. The ADC stage 102 receives an input signal (VIN) for digitization. The ADC stage 102 digitizes VIN to a predetermined resolution, and provides a digital value 120 representing Vin to the combination logic 114. The ADC stage 102 provides a residue signal 124 to a subsequent ADC stage for digitization. Although two ADC stages (ADC stages 102 and 104) are shown in FIG. 1, the ADC 100 may include more than two ADC stages. The ADC stage 104 receives a residue signal from a previous ADC stage, and digitizes the residue signal to a predetermined resolution. The ADC stage 104 provide a digital value 122 representing the residue signal to the combination logic 114. The combination logic 114 combines the digital values received from the ADC stages to generate a digital output value (DOUT) representing DIN.

The ADC stage 102 includes a CDAC 106, and the ADC stage 104 includes a CDAC 108. The CDACs 106 and 108 include switched capacitors coupled in parallel. The switched capacitors may be banks of binary weighted capacitors.

The voltage reference circuit 112 generates a reference voltage ($V_{REF}$) for use by the ADC stages. The voltage reference circuit 112 is coupled to the reference buffer circuit 110. The reference buffer circuit 110 buffers the reference voltage and provides a buffered reference voltage 118 for use by the ADC stages (for instance by the CDACs 106 and 108). The reference buffer circuit 110 provides the buffered reference voltage 118 to multiple inputs of each CDAC, e.g., to each switched capacitor bank of each CDAC. The reference buffer circuit 110 includes output circuitry that is distributed to provide drive for the buffered reference voltage 118 relatively near to the different switched capacitor circuits of the CDACs. In this way, the nonlinearity in the buffered reference voltage 118 due to routing inductance and capacitance is reduced. Also, the settling time provided by the ADC stages to accommodate CDAC switching may be reduced to reduce the overall conversion time the ADC stages.

Figure 2A:
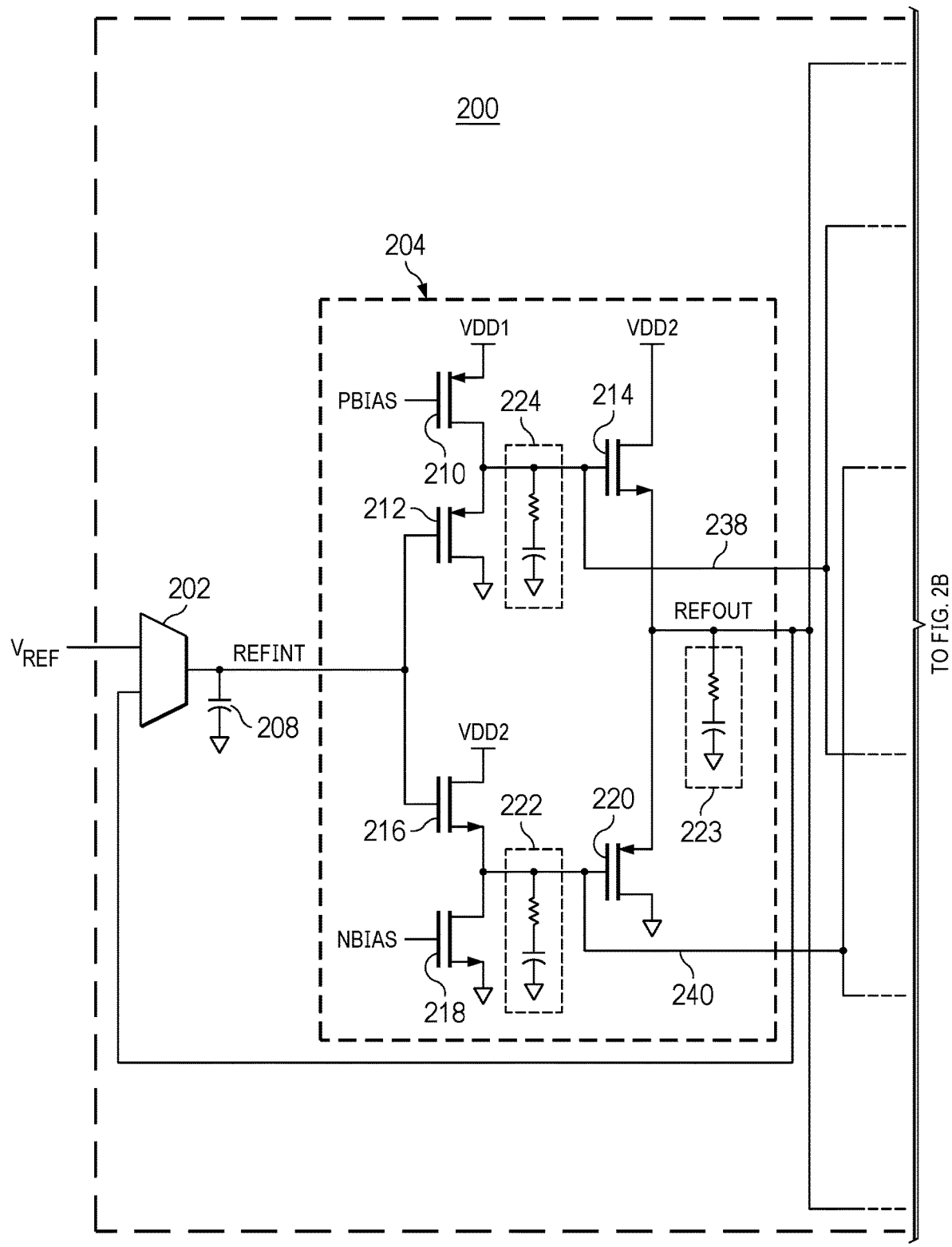
FIGS. 2A and 2B are a schematic diagram of a first multi-point reference distribution circuit suitable for use in the analog-to-digital converter of FIG. 1.
Figure 2B:
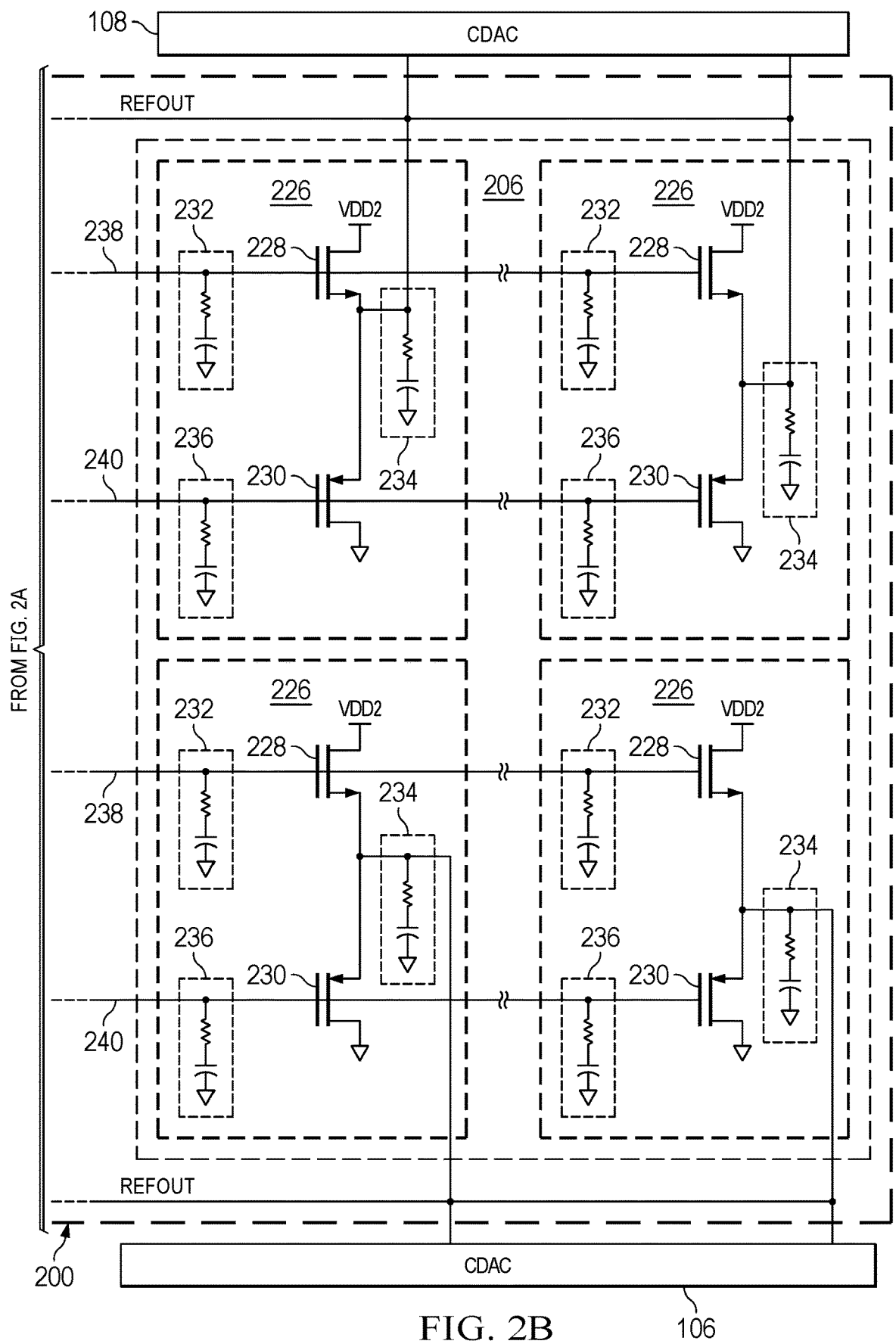

FIGS. 2A and 2B are a schematic diagram of a first example multi-point reference distribution circuit 200. The multi-point reference distribution circuit 200 is an example of the reference buffer circuit 110. The multi-point reference distribution circuit 200 includes an amplifier 202, a pre-driver circuit 204, and an output circuit 206. The CDAC 106 and the CDAC 108 are shown coupled to the multi-point reference distribution circuit 200 for reference. A first input of the amplifier 202 is coupled to the voltage reference circuit 112 for receipt of the reference voltage ($V_{REF}$). A second input of the amplifier 202 is coupled to an output of the pre-driver circuit 204 for receipt of reference feedback. An output of the amplifier 202 is coupled to an input of the pre-driver circuit 204. A capacitor 208 be coupled between the output of the amplifier 202 and a reference terminal (e.g., ground) to filter amplifier output signal (REFINT).

The pre-driver circuit 204 isolates the output of the amplifier 202 (the output signal REFINT) from changes in current drawn by the load circuit (e.g., the CDACs 106 and 108). The pre-driver circuit 204 includes transistors 210, 212, 214, 216, 218, and 220, and snubber circuits 222, 223, and 224. The transistors 210, 212, and 214 control the current sourced to a REFOUT output of the pre-driver circuit 204. The transistors 216, 218, and 220 control the current drawn from the REFOUT output of the pre-driver circuit 204. The transistors 210, 212, and 220 may be p-type field effect transistors (PFETs), as shown. The transistors 214, 216, and 218 may be n-type field effect transistors (NFETs) as shown.

The transistor 210 includes a first terminal "also referred to as a "current terminal" (e.g., source) coupled to a first power supply terminal (VDD1). A second terminal also referred to as a "current terminal" (e.g., drain) of the transistor 210 is coupled to a first current terminal (e.g., source) of the transistor 212 and a control terminal (e.g., gate) of the transistor 214. A control terminal (e.g., gate) of the transistor 210 is coupled to a bias voltage circuit (PBIAS). A second current terminal (e.g., drain) of the transistor 212 is coupled to the reference voltage terminal (e.g., ground). A control terminal (e.g., gate) of the transistor 212 is coupled to the output of the amplifier 202. A first current terminal (e.g., drain) of the transistor 214 is coupled to a second power supply terminal (VDD2). A power supply voltage provided at VDD2 may be different from a power supply voltage provided at VDD1. A second current terminal (e.g., source) of the transistor 214 provides the REFOUT output of the pre-driver circuit 204. The snubber circuit 223 includes a resistor and a capacitor coupled in series between the second current terminal of the transistor 214 and the reference voltage terminal (e.g., ground). The snubber circuit 224 includes a resistor and a capacitor coupled in series between the control terminal of the transistor 214 and the reference voltage terminal.

The transistor 216 includes a first current terminal (e.g., drain) coupled to the second power supply terminal. A second current terminal (e.g., source) of the transistor 216 is coupled to a first current terminal (e.g., drain) of the transistor 218 and a control terminal (e.g., gate) of the 220. A control terminal (e.g., gate) of the transistor 216 is coupled to the output of the amplifier 202. A second current terminal (e.g., source) of the transistor 218 is coupled to the reference voltage terminal (e.g., ground). A control terminal (e.g., gate) of the transistor 218 is coupled to a bias voltage circuit (NBIAS). A first current terminal (e.g., source) of the transistor 220 is coupled to the second current terminal of the transistor 214. A second current terminal (e.g., drain) of the transistor 220 is coupled to the reference voltage terminal (e.g., ground). The snubber circuit 222 includes a resistor and a capacitor coupled in series between the control terminal of the transistor 220 and the reference voltage terminal (e.g., ground).

The output circuit 206 is coupled to the REFOUT output of the pre-driver circuit 204, an output taken from the second current terminal of the transistor 210 (labeled as a node 238 in FIGS. 2A and 2B, and an output taken from the second current terminal of the transistor 216 (labeled as a node 240 in FIGS. 2A and 2B). The output circuit 206 includes transistor pairs 226 distributed so that a transistor pair 226 is positioned in proximity to a reference voltage input of the CDAC 106 or the CDAC 108. While four transistor pairs 226 are shown in FIG. 2B, examples of the multi-point reference distribution circuit 200 may include any number of transistor pairs 226 (e.g., more than four transistor pairs 226). Each transistor pair 226 includes transistors 228 and 230, and snubber circuits 232, 234, and 236. The transistor 228 may be an NFET, and the transistor 230 may be a PFET, as shown. Current drawn by the reference voltage inputs of the CDACs 106 and 108 flows, in large part, from local power supply terminals, rather than from the pre-driver circuit 204 or the amplifier 202. Placement of the transistor pair 226 proximate (e.g., less than 50 micrometers distant from) a reference voltage input (e.g., of a CDAC) reduces the parasitic inductance and capacitance between the output of the transistor pair 226 and the reference voltage input, which reduces the nonlinearity in the reference voltage provided at the reference voltage input.

A first current terminal of the transistor 228 is coupled to the second power supply terminal. A second current terminal (e.g., source) of the transistor 228 provides the output of the transistor pair 226, and is coupled to a CDAC reference voltage input. The snubber circuit 234 is coupled between the second current terminal of the transistor 228 and the reference voltage terminal (e.g., ground). The snubber circuit 234 includes a resistor and a capacitor coupled in series. The snubber circuit 234 can be implemented using relatively small resistive and capacitive values. For example, the resistor of the snubber circuit 234 may have a resistance of a few ohms and the capacitor of the snubber circuit 234 may have a capacitance of less than a pico-farad. A control terminal (e.g., gate) of the transistor 228 is coupled to second current terminal of the transistor 210. The snubber circuit 232 is coupled between the control terminal of the transistor 228 and the reference voltage terminal (e.g., ground). The snubber circuit 232 includes a resistor and a capacitor coupled in series.

A first current terminal (e.g., source) of the transistor 230 is coupled to the second current terminal of the transistor 228. A second current terminal (e.g., drain) of the transistor 230 is coupled to the reference voltage terminal (e.g., ground). A control terminal (e.g., gate) of the transistor 230 is coupled to the second current terminal of the transistor 216. The snubber circuit 236 is coupled between the control terminal of the transistor 230 and the reference voltage terminal (e.g., ground). The snubber circuit 236 includes a resistor and a capacitor coupled in series.

Figure 3A:
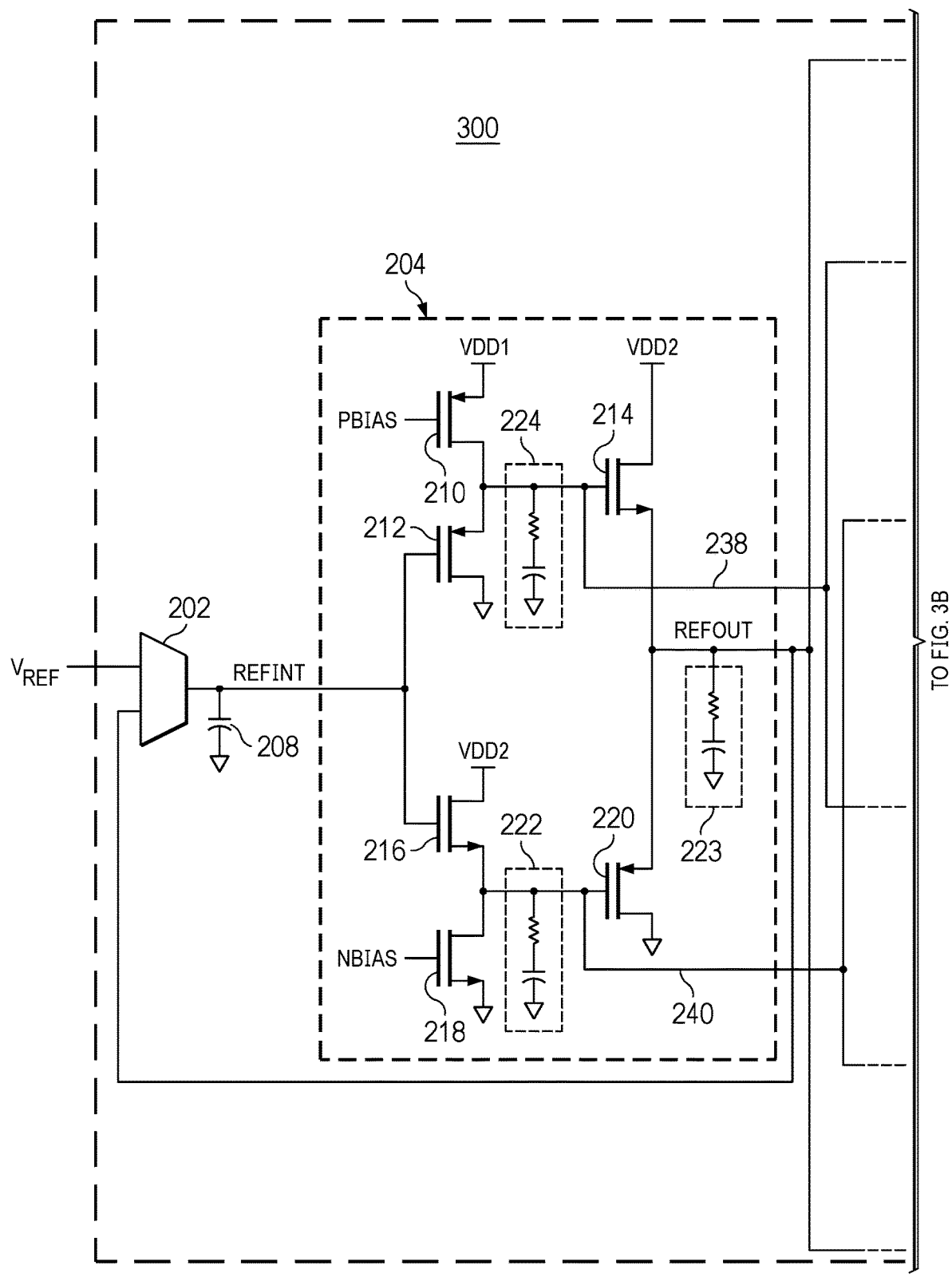
FIGS. 3A and 3B are a schematic diagram of a second multi-point reference distribution circuit suitable for use in the analog-to-digital converter of FIG. 1.
Figure 3B:
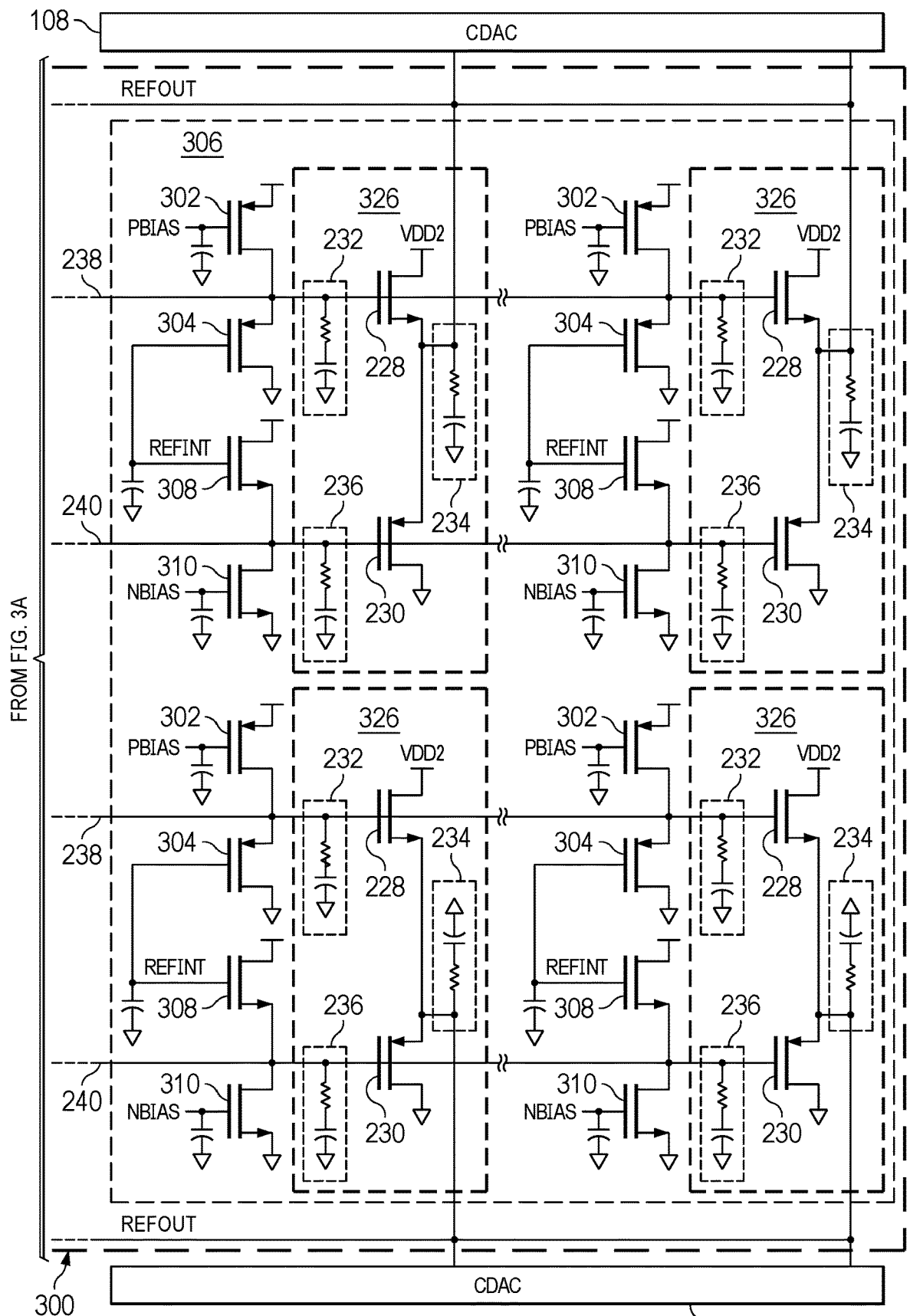

FIGS. 3A and 3B are a schematic diagram of a second example multi-point reference distribution circuit 300. The multi-point reference distribution circuit 300 is an example of the reference buffer circuit 110. The multi-point reference distribution circuit 300 includes the amplifier 202 and the pre-driver circuit 204 as described with respect to the multi-point reference distribution circuit 200. The multi-point reference distribution circuit 300 also include an output circuit 306 coupled to the pre-driver circuit 204. The output circuit 306 is similar to the output circuit 206, and includes the transistors 228 and 230, and the snubber circuits 232, 234, and 236 (shown as transistor pairs 326). The output circuit 306 also includes drive circuitry at the control terminals of the transistor 228 and the transistor 230. The drive circuitry may be considered an extension and distribution of the pre-driver circuit 204. The addition of the drive circuitry reduces inductance in the paths of the signals controlling the transistor 228 and transistor 230, and associated signal degradation. While four transistor pairs 326 are shown in FIG. 3B, examples of the multi-point reference distribution circuit 300 may include any number of transistor pairs 326 (e.g., more than four transistor pairs 226), each transistor pair 326 coupled to drive circuitry as shown in FIG. 3B.

The drive circuitry includes transistors 302, 304, 308, and 310. The transistors 302 and 304 may be PFETs, as shown. The transistors 308 and 310 may be NFETs, as shown. The transistors 302 and 304 are coupled to the control terminal of the transistor 228. A first current terminal (e.g., source) of the transistor 302 is coupled to the second power supply terminal, and a second current terminal (e.g., drain) of the transistor 302 is coupled to the control terminal of the transistor 228. A control terminal of the transistor 302 is coupled to the control terminal of the transistor 210. A first current terminal (e.g., source) of the transistor 304 is coupled to the second current terminal of the transistor 302, and a second current terminal (e.g., drain) of the transistor 304 is coupled to the reference voltage terminal (e.g., ground). A control terminal (e.g., gate) of the transistor 304 is coupled to the control terminal of the transistor 212.

A first current terminal (e.g., drain) of the transistor 308 is coupled to the second power supply terminal, and a second current terminal (e.g., source) of the transistor 308 is coupled to the control terminal of the transistor 230. A control terminal of the transistor 308 is coupled to the control terminal of the transistor 304. A first current terminal (e.g., drain) of the transistor 310 is coupled to the second current terminal of the transistor 308, and a second current terminal of the transistor 310 is coupled to the reference voltage terminal (e.g., ground). A control terminal of the transistor 310 is coupled to the control terminal of the transistor 218.

The multi-point reference distribution circuit 200 may allow settling error in the CDACs to be reduced by, for example, a factor of 8 relative to use of a single output reference buffer. The multi-point reference distribution circuit 300 may further improve settling time. For example, the multi-point reference distribution circuit 300 allows settling error in the CDACs to be reduced by a factor of 10 relative to the use of a single output reference buffer.

Figure 4B:
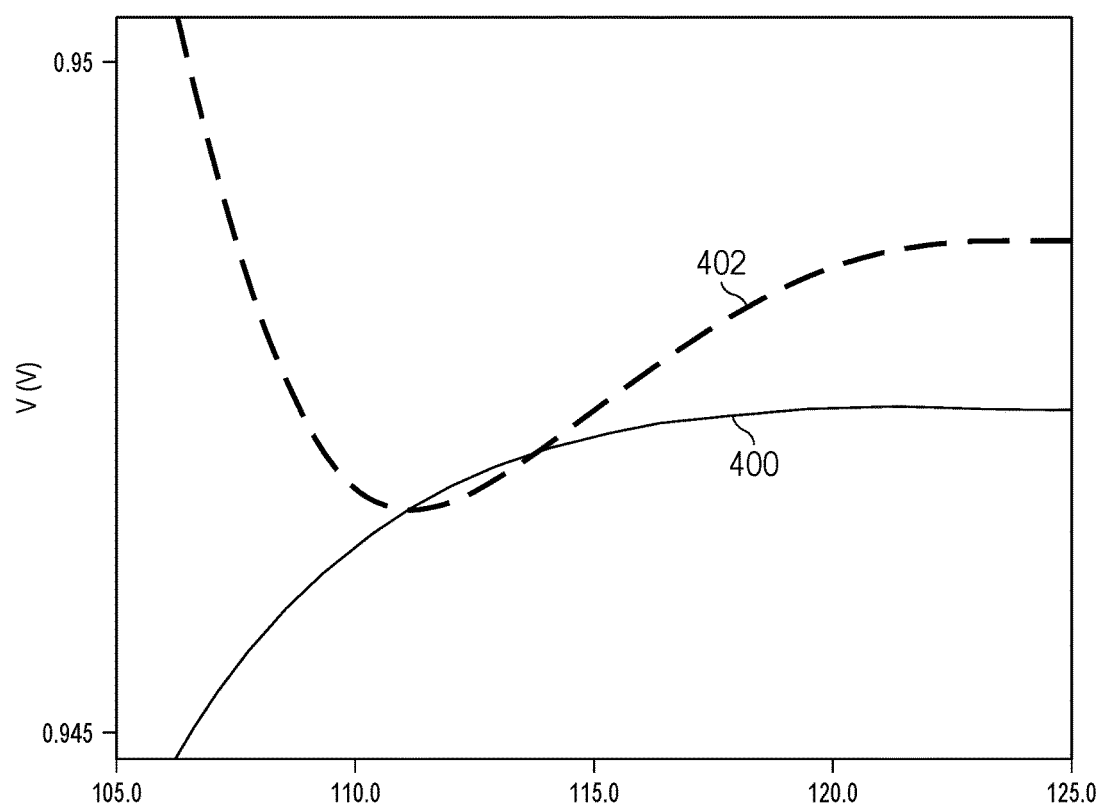

FIGS. 4A and 4B are signal diagrams comparing output of a single-point reference distribution circuit to output of the multi-point reference distribution circuit 200. FIG. 4A shows a buffered reference voltage 400 provided by an output of the multi-point reference distribution circuit 300 (provided at the second current terminal of the transistor 228), and a buffered reference voltage 402 provided by an output of a single output buffer circuit. The buffered reference voltage 400 is well behaved and settles to a final value as a first order resistor-capacitor charging function. In contrast, the buffered reference voltage 402 oscillates (rings) and takes longer to settle to the final value. FIG. 4B shows a zoomed version of the final 20 pico-seconds of FIG. 4A.

FIG. 4B shows that in the final 20 pico-seconds of the graph, the buffered reference voltage 400 has an error of about 140 microvolts, while the buffered reference voltage 402 has an error of about 1.23 millivolts. Accordingly, the error in the buffered reference voltage 402 is almost ten times higher than that of the buffered reference voltage 400. Also, the settling time when using the buffered reference voltage 402 is increased, relative to the settling time needed with the 400, to allow the ringing on buffered reference voltage 402 to subside.

Figure 5:
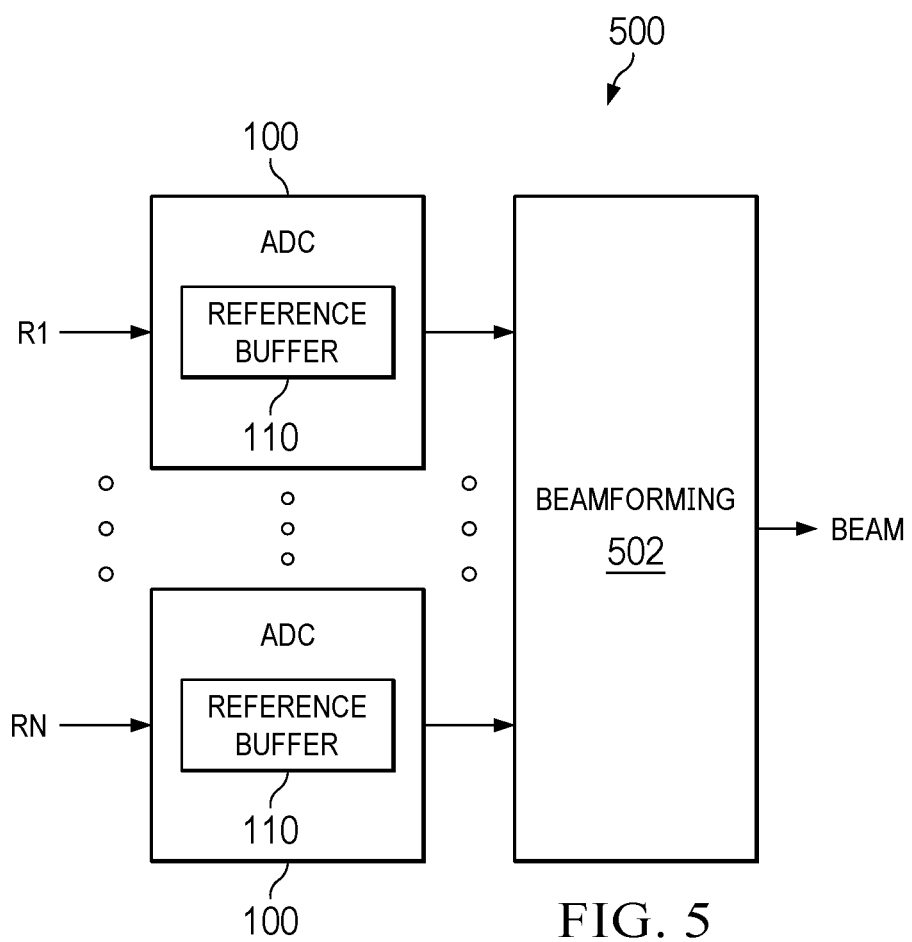
FIG. 5 is a block diagram of a digital beamforming system that includes the analog-to-digital converter of FIG. 1.

FIG. 5 is a block diagram of a digital beamforming system 500. The digital beamforming system 500 includes multiple instances of the ADC 100 coupled to a beamforming circuit 502. Each instance of the ADC 100 is coupled to a receiver circuit (not shown) that provides a signal (R1-RN) to the ADC to be digitized. Each ADC 100 includes the reference buffer circuit 110, which may be implemented as the multi-point reference distribution circuit 200 or the multi-point reference distribution circuit 300. The ADCs digitize the received signals and provide digital values representing the received signals to the beamforming circuit 502. The beamforming circuit 502 weights the digital values received from the ADCs and sums the weighted values to produce a BEAM signal representing a signal received from a selected direction.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

Also, in this description, the recitation "based on" means "based at least in part on." Therefore, if X is based on Y, then X may be a function of Y and any number of other factors.

A device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal," "node," "interconnection," "pin" and "lead" are used interchangeably. Unless specifically stated to the contrary, these terms are generally used to mean an interconnection between or a terminus of a device element, a circuit element, an integrated circuit, a device or other electronics or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While the use of particular transistors is described herein, other transistors (or equivalent devices) may be used instead with little or no change to the remaining circuitry. For example, a field effect transistor ("FET") (such as an n-channel FET (NFET) or a p-channel FET (PFET)), a bipolar junction transistor (BJT—e.g., NPN transistor or PNP transistor), an insulated gate bipolar transistor (IGBT), and/or a junction field effect transistor (JFET) may be used in place of or in conjunction with the devices described herein. The transistors may be depletion mode devices, drain-extended devices, enhancement mode devices, natural transistors, or other types of device structure transistors. Furthermore, the devices may be implemented in/over a silicon substrate (Si), a silicon carbide substrate (SiC), a gallium nitride substrate (GaN) or a gallium arsenide substrate (GaAs).

References may be made in the claims to a transistor's control input and its current terminals or its terminals. In the context of a FET, the control input is the gate, and the current terminals are the drain and source. In the context of a BJT, the control input is the base, and the current terminals are the collector and emitter.

References herein to a FET being "ON" or "enabled" means that the conduction channel of the FET is present and drain current may flow through the FET. References herein to a FET being "OFF" or "disabled" means that the conduction channel is not present so drain current does not flow through the FET. An "OFF" FET, however, may have current flowing through the transistor's body-diode.

Circuits described herein are reconfigurable to include additional or different components to provide functionality at least partially similar to functionality available prior to the component replacement. Components shown as resistors, unless otherwise stated, are generally representative of any one or more elements coupled in series and/or parallel to provide an amount of impedance represented by the resistor shown. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

While certain elements of the described examples are included in an integrated circuit and other elements are external to the integrated circuit, in other example embodiments, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. In this description, unless otherwise stated, "about," "approximately" or "substantially" preceding a parameter means being within +/−10 percent of that parameter or, if the parameter is zero, a reasonable range of values around zero.

Modifications are possible in the described examples, and other examples are possible, within the scope of the claims.

What is claimed is:

1. A circuit comprising:
   an amplifier having first and second inputs and an output;
   a first transistor having a control terminal coupled to the output of the amplifier, a first terminal, and a second terminal;
   a second transistor having a first terminal, a second terminal coupled to the first terminal of the first transistor, and a control terminal;
   a third transistor having a first terminal, a second terminal coupled to the second input of the amplifier, and a control terminal coupled to the second terminal of the second transistor;
   a fourth transistor having a control terminal coupled to the output of the amplifier, a first terminal, and a second terminal;

a fifth transistor having a control terminal, a first terminal coupled to the second terminal of the fourth transistor, and a second terminal coupled to a reference terminal; and a sixth transistor having a control terminal coupled to the first terminal of the fifth transistor, a first terminal coupled to the second terminal of the third transistor, and a second terminal coupled to the reference terminal.

2. The circuit of claim 1, further comprising:
a seventh transistor having a control terminal coupled to the first terminal of the first transistor, a first terminal, and a second terminal coupled to the second terminal of the third transistor.

3. The circuit of claim 2, further comprising:
an eighth transistor having a first terminal coupled to the first terminal of the third transistor, a second terminal coupled to the control terminal of the seventh transistor, and a control terminal coupled to the control terminal of the second transistor; and
a ninth transistor having a first terminal coupled to the second terminal of the eighth transistor, a second terminal coupled to the reference terminal, and a control terminal coupled to the output of the amplifier.

4. The circuit of claim 2, further comprising:
an eighth transistor having a control terminal coupled to the first terminal of the sixth transistor, a first terminal coupled to the second terminal of the seventh transistor, and a second terminal coupled to the reference terminal.

5. The circuit of claim 4, further comprising:
a ninth transistor having a first terminal coupled to the first terminal of the third transistor, a second terminal coupled to the control terminal of the eighth transistor, and a control terminal coupled to the output of the amplifier; and
a tenth transistor having a first terminal coupled to the second terminal of the ninth transistor, a second terminal coupled to the reference terminal, and a control terminal coupled to the control terminal of the fifth transistor.

6. The circuit of claim 4, further comprising:
a first resistor and a first capacitor coupled in series between the control terminal of the seventh transistor and a reference terminal; and
a second resistor and a second capacitor coupled in series between the control terminal of the eighth transistor and the reference terminal.

7. The circuit of claim 1, further comprising:
a first resistor and a first capacitor coupled in series between the control terminal of the third transistor and a reference terminal; and
a second resistor and a second capacitor coupled in series between the control terminal of the sixth transistor and the reference terminal.

8. A circuit comprising:
an amplifier having a first input, a second input, and an output;
a pre-driver circuit having an input coupled to the output of the amplifier, a first output, a second output, and a third output coupled to the second input of the amplifier; and
an output circuit including:
a first transistor having a control terminal coupled to the first output of the pre-driver circuit; a first terminal, and a second terminal coupled to the third output of the pre-driver circuit; and a second transistor having a control terminal coupled to the second output of the pre-driver circuit, a first terminal coupled to the second terminal of the first transistor, and a second terminal coupled to a reference terminal.

9. The circuit of claim 8, wherein the pre-driver circuit includes:
a third transistor having a control terminal coupled to the output of the amplifier, a first terminal configured as the first output of the pre-driver circuit, and a second terminal coupled to a reference terminal;
a fourth transistor having a first terminal, and a second terminal coupled to the first terminal of the third transistor, and a control terminal; and
a fifth transistor having a first terminal, a second terminal coupled to the second input of the amplifier, and configured as the third output of the pre-driver circuit, and a control terminal coupled to the second terminal of the fourth transistor;
a sixth transistor having a control terminal coupled to the output of the amplifier, a first terminal, and a second terminal configured as the second output of the pre-driver circuit;
a seventh transistor having a control terminal, a first terminal coupled to the second terminal of the sixth transistor, a second terminal coupled to the reference terminal; and
an eighth transistor having a control terminal coupled to the first terminal of the seventh transistor, a first terminal coupled to the second terminal of the fifth transistor, and a second terminal coupled to the reference terminal.

10. The circuit of claim 9, wherein the pre-driver circuit includes:
a first snubber circuit coupled to the control terminal of the fifth transistor; and
a second snubber circuit coupled to the control terminal of the eighth transistor.

11. The circuit of claim 8, wherein the output circuit includes:
a third transistor having a first terminal, a second terminal coupled to the control terminal of the first transistor, and a control terminal coupled to a first bias voltage circuit; and
a fourth transistor having a first terminal coupled to the second terminal of the third transistor, a second terminal coupled to the reference terminal, and a control terminal coupled to the output of the amplifier.

12. The circuit of claim 8, wherein the output circuit includes:
a third transistor having a first terminal, a second terminal coupled to the control terminal of the second transistor, and a control terminal coupled to the output of the amplifier; and
a fourth transistor having a first terminal coupled to the second terminal of the third transistor, a second terminal coupled to the reference terminal, and a control terminal coupled to a second bias voltage circuit.

13. The circuit of claim 8, further comprising:
a first snubber circuit coupled to the control terminal of the first transistor; and
a second snubber circuit coupled to the control terminal of the second transistor.

14. An analog-to-digital converter (ADC) comprising:
a first capacitive digital-to-analog converter (CDAC) having an input;
a second CDAC having an input;

a reference buffer coupled to the first CDAC and the second CDAC, the reference buffer including:
an amplifier having a first input, a second input, and an output;
a pre-driver circuit having an input coupled to the output of the amplifier, a first output, a second output, and a third output coupled to the second input of the amplifier; and
an output circuit including:
a first transistor having a control terminal coupled to the first output of the pre-driver circuit, a first terminal, and a second terminal coupled to the third output of the pre-driver circuit and the input of the first CDAC;
a second transistor having a control terminal coupled to the second output of the pre-driver circuit, a first terminal coupled to the second terminal of the first transistor, and a second terminal coupled to a reference terminal;
a third transistor having a control terminal coupled to the first output of the pre-driver circuit, a first terminal, and a second terminal coupled to the third output of the pre-driver circuit and the input of the second CDAC; and
a fourth transistor having a control terminal coupled to the second output of the pre-driver circuit, a first terminal coupled to the second terminal of the third transistor, and a second terminal coupled to a reference terminal.

15. The ADC of claim 14, wherein the pre-driver circuit includes:
a fifth transistor having a control terminal coupled to the output of the amplifier, a first terminal configured as the first output of the pre-driver circuit, and a second terminal coupled to a reference terminal;
a sixth transistor having a first terminal, and a second terminal coupled to the first terminal of the fifth transistor, and a control terminal; and
a seventh transistor having a first terminal, a second terminal coupled to the second input of the amplifier, and configured as the third output of the pre-driver circuit, and a control terminal coupled to the second terminal of the sixth transistor;
an eighth transistor having a control terminal coupled to the output of the amplifier, a first terminal, and a second terminal configured as the second output of the pre-driver circuit;
a ninth transistor having a control terminal, a first terminal coupled to the second terminal of the eighth transistor, a second terminal coupled to the reference terminal;
a tenth transistor having a control terminal coupled to the first terminal of the ninth transistor, a first terminal coupled to the second terminal of the seventh transistor, and a second terminal coupled to the reference terminal;
a first snubber circuit coupled to the control terminal of the seventh transistor; and
a second snubber circuit coupled to the control terminal of the tenth transistor.

16. The ADC of claim 14, wherein the output circuit includes:
a fifth transistor having a first terminal, a second terminal coupled to the control terminal of the first transistor, and a control terminal coupled to a first bias voltage circuit; and
a sixth transistor having a first terminal coupled to the second terminal of the fifth transistor, a second terminal coupled to the reference terminal, and a control terminal coupled to the third output of the pre-driver circuit.

17. The ADC of claim 14, wherein the output circuit includes:
a fifth transistor having a first terminal, a second terminal coupled to the control terminal of the second transistor, and a control terminal coupled to the third output of the pre-driver circuit; and
a sixth transistor having a first terminal coupled to the second terminal of the fifth transistor, a second terminal coupled to the reference terminal, and a control terminal coupled to a second bias voltage circuit.

18. The ADC of claim 14, wherein the output circuit includes:
a fifth transistor having a first terminal, a second terminal coupled to the control terminal of the third transistor, and a control terminal coupled to a first bias voltage circuit; and
a sixth transistor having a first terminal coupled to the second terminal of the fifth transistor, a second terminal coupled to the reference terminal, and a control terminal coupled to the third output of the pre-driver circuit.

19. The ADC of claim 14, wherein the output circuit includes:
a fifth transistor having a first terminal, a second terminal coupled to the control terminal of the fourth transistor, and a control terminal coupled to the third output of the pre-driver circuit; and
a sixth transistor having a first terminal coupled to the second terminal of the fifth transistor, a second terminal coupled to the reference terminal, and a control terminal coupled to a second bias voltage circuit.

20. The ADC of claim 14, further comprising:
a first snubber circuit coupled to the control terminal of the first transistor;
a second snubber circuit coupled to the control terminal of the second transistor;
a third snubber circuit coupled to the control terminal of the third transistor; and
a fourth snubber circuit coupled to the control terminal of the fourth transistor.

* * * * *